United States Patent [19]

Hartwig

[11] Patent Number: 5,138,286
[45] Date of Patent: Aug. 11, 1992

[54] METHOD AND DEVICE FOR VOLTAGE FREQUENCY TRANSFORMATION

[75] Inventor: Hagen Hartwig, Erlangen, Fed. Rep. of Germany

[73] Assignee: Siemens Aktiengesellschaft, Berlin and Munich, Fed. Rep. of Germany

[21] Appl. No.: 745,421

[22] Filed: Aug. 15, 1991

[30] Foreign Application Priority Data

Sep. 3, 1990 [EP] European Pat. Off. ............ 90116904

[51] Int. Cl.$^5$ ................................................ H03L 7/06
[52] U.S. Cl. ...................... 331/1 R; 331/17; 388/922
[58] Field of Search ............ 331/1 R, 1 A, 74; 388/911, 922

[56] References Cited

U.S. PATENT DOCUMENTS 3,260,943 7/1966 Huelsman et al. ............... 328/69
5,008,564 4/1991 Hartwig ........................ 331/1 R

FOREIGN PATENT DOCUMENTS 9011646 10/1990 Fed. Rep. of Germany .

OTHER PUBLICATIONS

IKW Berichte, Mar. 1987, pp. 130-140, Baiersdorf, DE; J. Jirmann; "Ein Spektral-Analysator für Amateure".

Primary Examiner—David Mis
Attorney, Agent, or Firm—Kenyon & Kenyon

[57] ABSTRACT

A method and the device for voltage frequency transformation produce a fast, highly accurate voltage frequency transformer which has a wide frequency range. This method and device can be implemented with simple means. The discontinuous output signal of an integrating voltage-controlled oscillator (VCO) is transformed back into a constant voltage via a frequency divider. Then the result is compared with the input voltage ($U_E$), and the result of the comparison is used to regulate the integrating, voltage-controlled oscillator (VCO).

19 Claims, 5 Drawing Sheets 5,138,286

METHOD AND DEVICE FOR VOLTAGE FREQUENCY TRANSFORMATION

BACKGROUND OF THE INVENTION

The present invention relates generally to methods and devices for voltage frequency transformation, and more specifically to such a device having additional digital or analog processing.

Transformation of a continuous signal to a discontinuous signal brings advantages with it for a number of applications. For this reason, voltage frequency transformers are used in the most varied fields of electrical technology and electronics. For example, for control of electric motors, the actual current or voltage values can be easily integrated into a digital control concept by transformation into a sequence of impulses proportional to the actual current or voltage value.

For inclusion of the acquisition of the actual voltage or current value, for example in the control concept of an electric motor, it is advantageous to digitalize the continuous signal at the location where it is acquired and to transmit it in the form of impulses with a varying impulse sequence frequency. Even when using analog control, it can be advantageous to use digital signals for signal transmission at first, and then to transform them back into a continuous signal, because of the fact that digital signals are less likely to be affected by interference.

Because of the small dimensions demanded in many applications, and the requirement for extremely fast and highly accurate digitalization of an input signal and with great frequency deviation at the lowest possible costs, it is not always possible to rely on conventional voltage frequency transformers available on the market.

International application PCT/DE 89/00197, discloses a method for voltage frequency transformation by which a fast and highly accurate voltage frequency transformer with a wide frequency range can be achieved. This method uses a conventional integrating frequencycontrolled oscillator, which gives off a highly accurate frequency signal (pulse sequence signal) by means of precise regulation. For this regulation, the output signal of the frequency-controlled oscillator is essentially transformed back into a constant voltage, via a precision monoflop which is clocked by a quartz oscillator, a precision switch and a low-pass filter, compared with the input voltage of the frequency-controlled oscillator and used for control of the latter.

The accuracy demanded for the frequency signal of the voltage-controlled oscillator—for example for the control of electric motors—lies at 0.5 per mil. At very high frequencies of the frequency signal (impulse duration approximately 100 ns), this accuracy can hardly be achieved. In addition, beat interference can occur in the formation of the precision impulses by the precision monoflop, resulting in inaccuracies in regulation.

The voltage frequency transformer described in the international application (PCT/DE 89/00197) allows a precise digital evaluation in a broad frequency range. However, to achieve the necessary accuracy for an analog evaluation, additional measures have to be taken at high frequencies. This increases the complexity of the voltage transformer.

The present invention is directed to the problem of developing a method and a device for voltage frequency transformation at great frequency deviation, using simple means.

SUMMARY OF THE INVENTION

The present invention solves this problem by applying the input voltage via a level adjustment circuit to an integrating, voltage-controlled oscillator. The output signal of the voltage-controlled oscillator is then passed to a frequency divider. The impulses of the output signal of the frequency divider are transformed into an impulse sequence with a constant pulse width and subsequently regulated in their amplitude in such a way that impulses with a constant area content are generated as precision impulses. A constant voltage is generated from the precision impulses, and a difference voltage is formed from the constant voltage and an input voltage, which is applied to the voltage-controlled oscillator for control, via a controller.

The division of the frequency of the output signal of the voltage-controlled oscillator allows an advantageous structure of the invention, in which the impulse sequence with a constant pulse width is generated using an impulse counter, where the impulse counter gives off a logic "1" output signal during a preset number of counter clock signals. Also as a result of the frequency division, the frequency of the counter clock signal can also be kept lower and nevertheless, while adhering to the sampling theorem with regard to the output signal of the frequency divider.

The use of generally available quartz oscillators represents a simple but very accurate possibility for generation of the counter clock signal. However, the counter clock signal can also be given off by an RC circuit, where the time constant of the RC element determines the duration of the counter clock impulses. Although this embodiment will not achieve the precision of a quartz oscillator at high frequencies of the counter clock signal, it represents an economical solution of the mid-range area of application.

A special case of the embodiment last stated results if the impulse counter counts only one impulse of the output signal of the frequency divider in each case. In this way, the frequency of the counter clock signal derived from the RC element can again be reduced, and therefore its accuracy can be significantly increased.

With the special case described, the impulse counter acts like a monoflop. This leads to another advantageous structure of the invention, in which the impulse sequence with a constant pulse width is generated in a clocked bistable switch, where the clock signal of the bistable switch is derived from an RC element.

In many devices already in operation, a digital control is not yet provided. The method of the present invention can also be advantageously used in these devices for voltage frequency transformation, if according to another structure of the invention, inverted precision impulses are generated for the precision impulses, where a control value is formed from the total of the precision impulses and the inverted precision impulses. The total value controls the supply voltage of the devices to generate the precision impulses in such a way that the area content of a precision impulse and of its inverted precision impulse are equal. With this measure, deviations in the turn-on and shut-off edges of the precision impulses are compensated, and therefore the prerequisites for accurate further analog processing are crated.

In an advantageous embodiment for analog evaluation, both the positive and the negative supply voltage of the devices generating the precision impulses is controlled in such a way that the total of their amounts is constant and the precision impulses lie symmetrically around a preset median voltage. With this, an offset can be compensated without influencing the overall amplification. The regulated precision impulses or the regulated inverted precision impulses can be transmitted via a transmission segment and subsequently, for example, be transformed into a constant voltage for further processing by analog devices.

If the method for voltage frequency transformation is used, for example, for a digital control concept, a structure of the invention is advantageous in which the impulses of the output signal of the integrating, voltage-controlled oscillator are counted in an evaluation logic, during a preset time span, with a preset period. The number of impulses per time unit is thereby directly proportional to the input voltage. Of course, other forms of median value formation can also be used. This digital evaluation is characterized by the fact that it is not generally affected by interference and makes it possible to transmit the impulses over an extended transmission distance, without restrictions in accuracy, since even "looping" of the impulses during the course of transmission does not have any effect on the accuracy of the method, as long as the impulses can still be recognized as such by the evaluation device.

With two other advantageous structures of the invention, which relate to digital evaluation, a quasi-doubling of the frequency of the output signal of the voltage-controlled oscillator can be achieved. In a first structure, the evaluation logic contains a digital counter, where the positive and negative edge of a pulse of the output signal of the voltage-controlled oscillator are used as the clock signal.

In a second structure, the evaluation logic also contains a digital counter, where the counter is clocked with the output signal of the voltage-controlled oscillator, and where the output signal of the voltage-controlled oscillator is used as an output signal which represents an additional binary position relative to the output signals of the counter.

DETAILED DESCRIPTION

Figure 1:
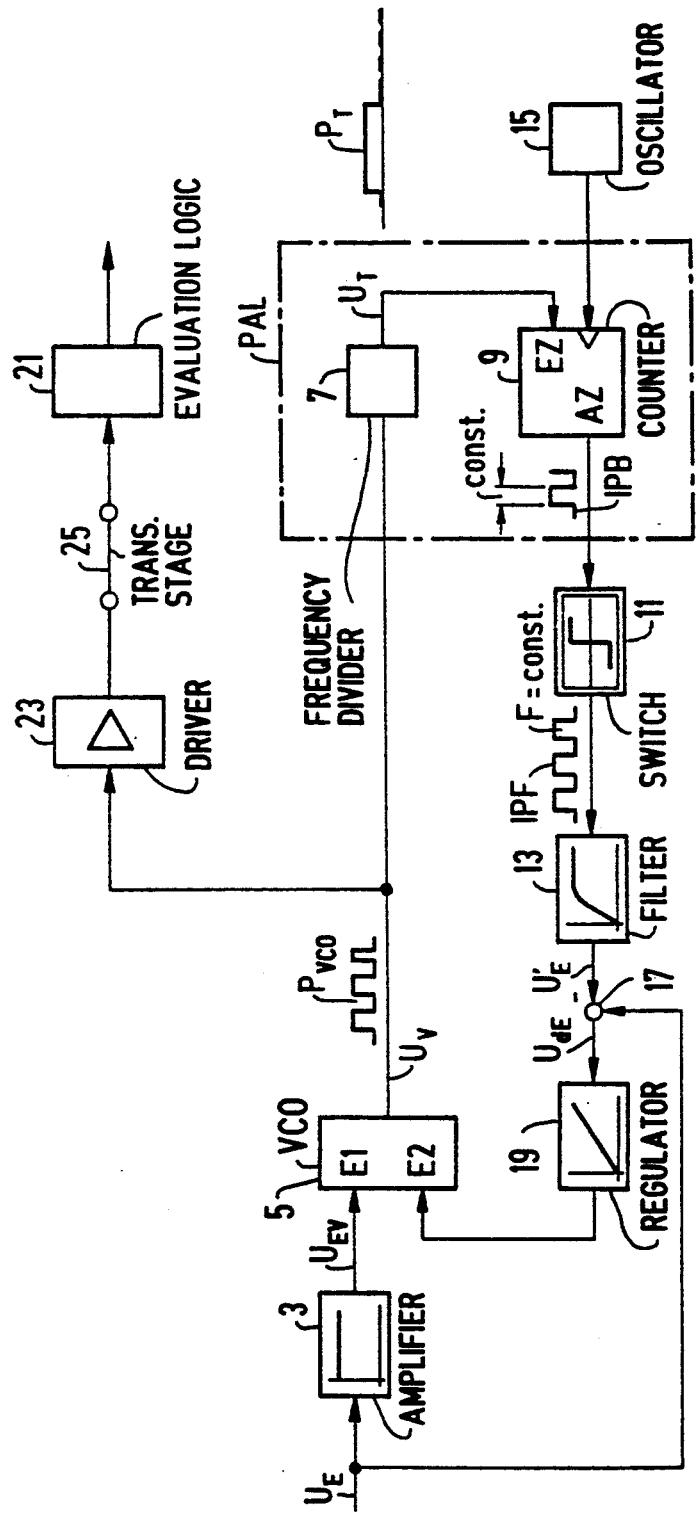
FIG. 1 illustrates the block diagram of a device voltage frequency transformation with additional digital processing of the signal.

The block diagram according to FIG. 1 shows one possibility for implementation of the method of the present invention. It consists of an amplifier 3 for level adjustment of an input voltage U.E. The output Voltage $U_{EV}$ of the amplifier 3 is passed to a first input E1 of an integrating voltage-controlled oscillator (VCO) 5. Because it is necessary to form a median value for the evaluation of the digital signal, an integrating VCO is required. The integrating VCO 5 delivers individual impulses $P_{vco}$, the frequency of which is proportional to the level of the input voltage $U_{EV}$. As a VCO, an emitter-coupled multivibrator, which is commercially available under the designation LS 624, can be used, for example. Such a VCO is characterized by a wide frequency range (approximately 2 to 42 MHz). However, less accuracy in the output signal $U_v$ (pulse sequence signal) must be acceptable in order to achieve the full frequency deviation.

Because of the inaccuracy of the VCO 5, its output signal $U_V$ is transformed back into a constant voltage $U_E$, via a control segment. This control segment consists of a frequency divider 7, an impulse counter 9, a switch 11 and a low-pass filter 13.

The clock input of the impulse counter 9 designated with a triangle is connected with an oscillator 15, which is preferably a quartz oscillator. The frequency divider 7 as well as the impulse counter 9 can be implemented with a PAL (Programmable Array Logic), designated with the broken line.

The frequency of the signal $P_{VCO}$ at the output of the VCO 5 is reduced by the frequency divider 7. At a frequency of the signal $P_{VCO}$ of 10 MHz and a division ratio of the frequency divider 7 of 64 : 1, the frequency of the divider output signal $U_R$ is approximately 150 kHz. Therefore, impulses $P_T$ with a longer impulse duration as compared with the impulses $P_{vco}$ of the voltage-controlled oscillator VCO are achieved. The rounding at the edges of the impulses caused by the turn-on and shut-off remain the same, so that the rounding of the impulses $P_T$ of the frequency divider 7 are minimized, with reference to the longer impulse duration.

The impulse counter 9 has the task, together with the oscillator 15, of generating a precision impulse IPB with a constant pulse width for every impulse $P_T$ of the output signal $U_T$ of the frequency divider 7. As soon as a signal logic "1" is applied to the input EZ of the impulse counter 9 and its clock input, the impulse counter outputs a logic signal "1" to its output AZ.

The output signal of the impulse counter 9 is set to logic "0" if the counter has counted a preset number of clock signals of the oscillator 15. This guarantees that for every impulse $P_T$ of the frequency divider 7, a precision impulse IPB with a constant impulse width will be generated at the output of the impulse counter 9. In an embodiment of the oscillator 15, the oscillator 15 has a frequency of 26 MHz and the precision impulses are formed from 127 impulses of the quartz oscillator.

The precision switch 11 generates precision impulses IPF with a constant area from the precision impulses IPB with a constant pulse width, by switching the precision impulses IPB with a constant voltage amplitude through at its output. Via the low-pass filter 13, the precision impulses IPF are now converted to a constant voltage $U_E$. This constant voltage $U_E$, is subtracted from the input voltage $U_E$ at the comparator 17, and the difference voltage $U_{dE}$ is applied to the VCO 5 as a control value, Via the regulator 19. At the output of the VCO 5, a regulated output signal $U_v$ is therefore created as an impulse sequence signal, in the form of individual impulses P, the frequency of which is proportional to the level of the input voltage $U_E$. This output signal $U_v$ can now be given to an evaluation logic 21 via a driver stage 23 and a transmission segment 25, and there, a value proportional to the input voltage $U_E$ is formed for further processing. Additional processing of the impulse sequence frequency can vary with regard to the selection of the scanning time points and the different types of median value formation. A special type of evaluation will still be explained in greater detail below.

Instead of using a quartz oscillator for the oscillator 15, the clock signal for the impulse counter 9 can also be derived from an RC element. The duration of the clock signal would then be determined by the time constant of the RC element.

Instead of using the oscillator-clocked impulse counter 9, the precision impulses IPB with a constant pulse width can also be generated by means of a clocked bistable switch. This possibility is explained below, using FIG. 2.

Figure 2:
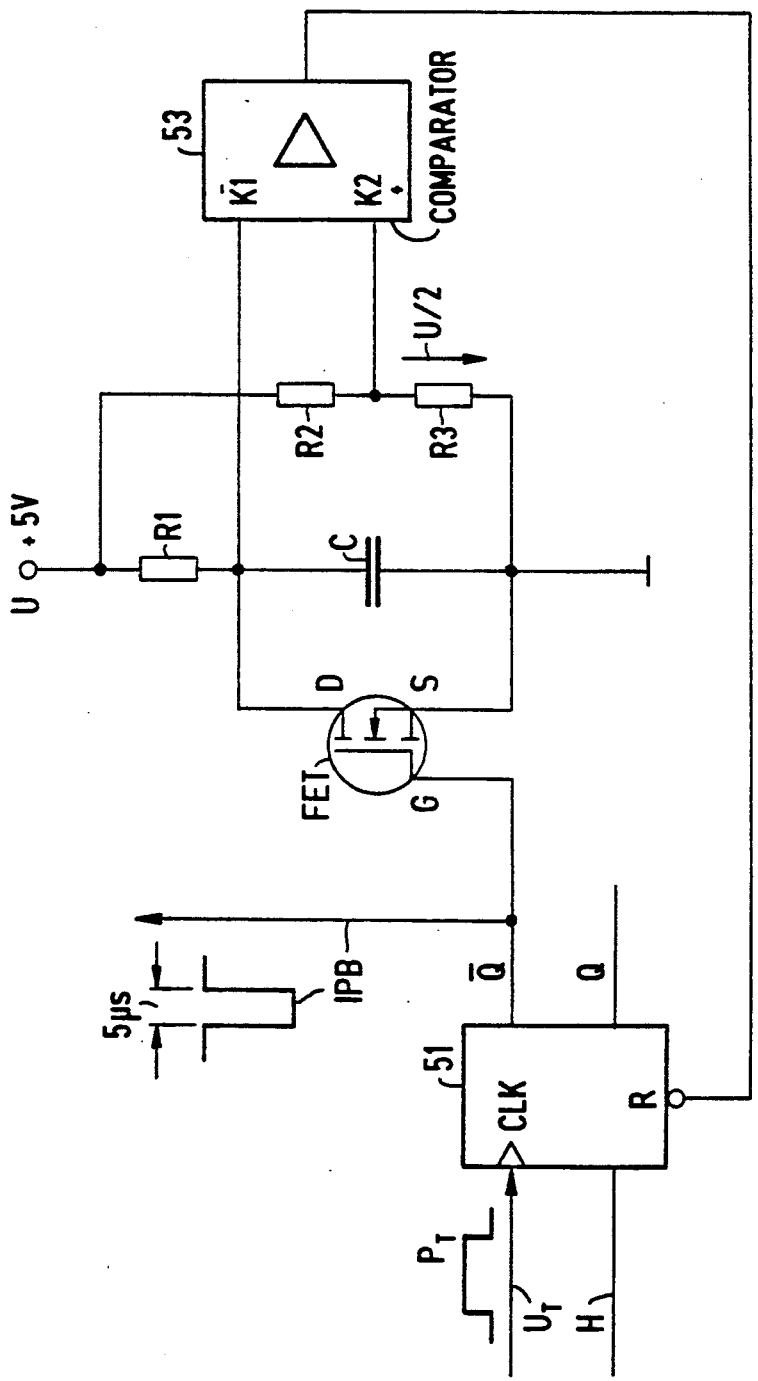
FIG. 2 shows a monoflop clocked via an RC element.

FIG. 2 shows a D flip-flop 51 as a bistable switch. The reset time of the D flip-flop 51 is derived from an RC element, which consists of the resistor R1 and the capacitor C. The output signal UT of the frequency divider 7 (FIG. 1) is applied to the clock input CLK of the D flip-flop DF. At the inverted output Q (the overline means an inverted output) of the D flip-flop 51, the precision impulses IPB with a constant pulse width can be collected. To generate the constant impulse width, the inverted output $\overline{Q}$ of the D flip-flop 51 is connected with a field effect transistor FET. The capacitor C, which is charged with the voltage U via the resistor R1, lies parallel to the drain D and source S of the field effect transistor FET. A first input K1 of a comparator 53 is also connected with the drain D of the field effect transistor FET. A second input K2 of the comparator 53 is connected with the center collector of a voltage divider consisting of the resistors R2 and R3, which is also supplied by the voltage U. The output of the comparator 53 is connected with the inverted reset input R of the D flip-flop 51. Because of the voltage divider, a constant voltage of U/2 is applied to the input K2 of the comparator 53. If the capacitor C is in the uncharged state, 0 volts are applied to the input K1 of the comparator 53.

If the clock input of the D flip-flop 51 is set to the "high" level by an incoming impulse $P_T$, a logic "0" is applied to the inverted output $\overline{Q}$ and therefore also at the gate G of the field effect transistor FET. The field effect transistor FET is therefore in the blocked state, so that the capacitor C is charged via the resistor R1. With an increasing charge of the capacitor C, the voltage at the input K1 of the comparator 53 increases. As soon as this voltage also reaches the value of U/2, the output signal of the comparator 53 is inverted and therefore the D flip-flop 51 is reset via its reset input R. The inverted output $\overline{Q}$ of the D flip-flop 51 and the gate G of the field effect transistor FET are set to the "high" level, which causes the drain-source channel D-S to become low resistance, so that the capacitor C discharges via the field effect transistor FET, which is switched through. This causes the voltage at the input K1 of the comparator 53 to go below the value U/2 again, so that the output signal of the comparator 53 and therefore the signal at the reset input R of the D flip-flop 51 to be inverted again, and the process starts over from the beginning. With this alternation of charging and discharging of the capacitor C in combination with the comparator 53, impulses IPB with a constant impulse width can be collected at the inverted output $\overline{Q}$ (or optionally at the output Q). The capacitor C and the resistors R1 to R3 are essentially responsible for the precision of the circuit. With a corresponding selection of the components, a drift error of the circuit of 1 per mil can be achieved over a temperature range of 50° K. The temperature coefficient of resistor and capacitor should not be greater than 15 ppM/° K. (parts per million/° Kelvin). The constant error, which is essentially caused by production technology defects of the capacitor C, is less than 5%.

Figure 3:
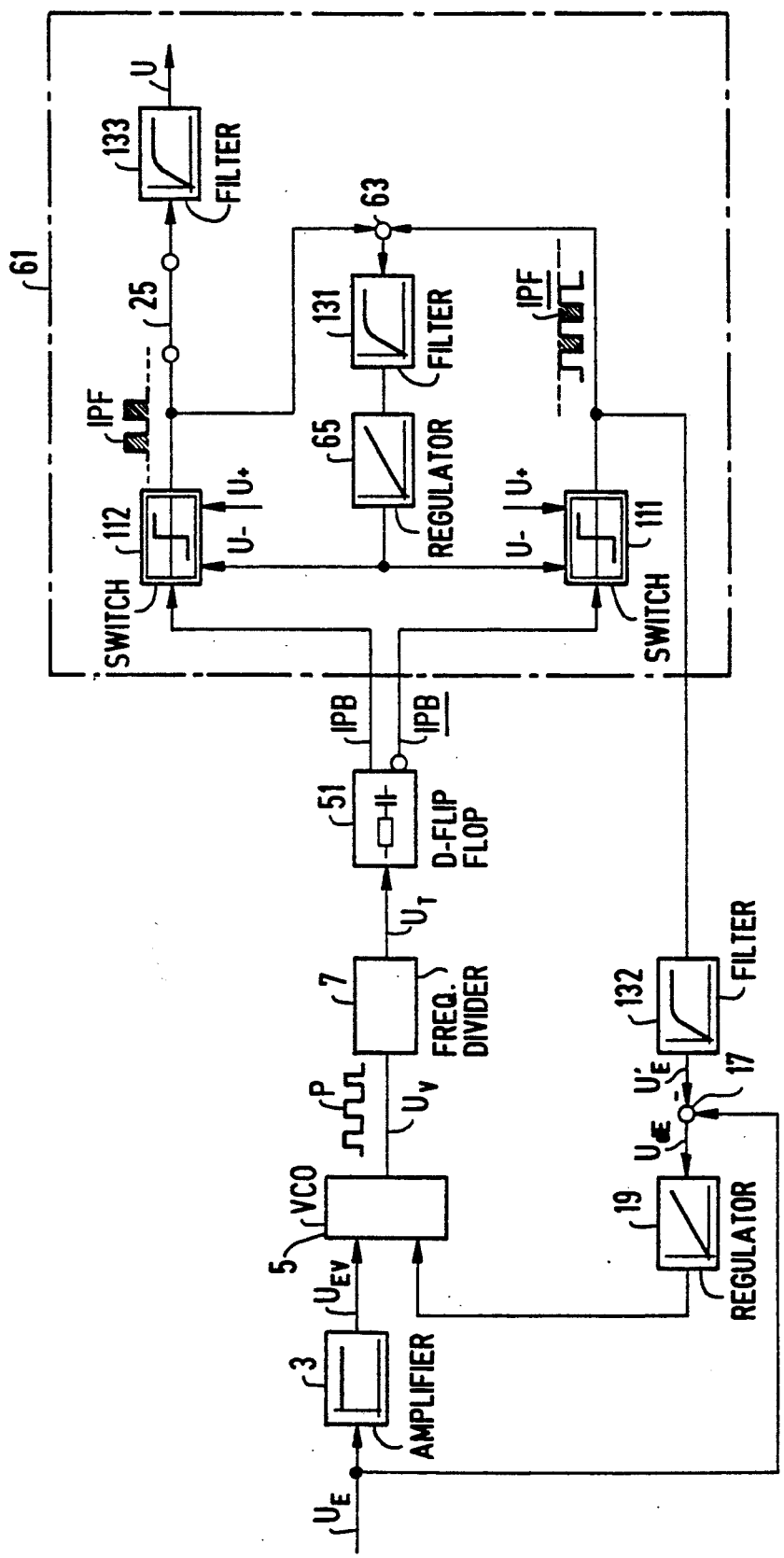
FIG. 3 shows the block diagram of a device for voltage frequency transformation with additional analog processing of the signal.

FIG. 3 shows a block diagram of a device for voltage frequency transformation with analog evaluation. The amplifier 3, the integrating frequency-controlled VCO 5 and the frequency divider 7 are the same as shown in FIG. 1. The control circuit to regulate the voltage-controlled oscillator VCO 5 now contains the D flip-flop 51 described in FIG. 2, instead of the impulse counter 9 (FIG. 1) and the oscillator 15 (FIG. 1). The serial arrangement of a resistor and a capacitor in block of the D flip-flop 51 is supposed to symbolize that the time duration of the precision impulses IPB and/or $\overline{IPB}$ at the outputs of the D flip-flop is dependent on the time constant of the RC element. The means which further belong to the control segment of the VCO are also already known from FIG. 1. The switch 11 from FIG. 1 is designated with 111 in FIG. 3, the low-pass filter 13 from FIG. 1 is designated with 132 in FIG. 3. The designations of the comparator 17 and the main regulator 19 were retained. The control segment to regulate the voltage-controlled oscillator VCO does not differ in terms of its method of effect from the method of effect already described on the basis of FIG. 1.

In contrast to the discontinuous, i.e. digital evaluation of the output signal $U_v$ of the VCO 5, which was described on the basis of FIG. 1, the discontinuous frequency signal is now supposed to be transmitted via the transmission segment 25 and subsequently processed in analog manner. For additional analog processing, however, the requirements concerning the quality of the impulses P, especially their turn-on and shut-off edges, are set very high. The constancy of the voltage time areas of the pulse pause signal must still be guaranteed, even at high impulse sequence frequencies. The impulse edges must demonstrate an accuracy of 1 per mil for analog evaluation. For this reason, the output signal $U_v$ of the VCO 5 must be prepared for additional analog processing.

The device surrounded with a broken line, for preparation of analog evaluation, referred to in brief as analog control device 61, serves this purpose. The non-inverted output signal IPB and the inverted output signal $\overline{IPB}$ are each passed to a precision switch 112 and 111 (this switch is simultaneously a component of the control segment for the VCO), respectively. At the output of the switch 112, the signal of the precision impulses IPF with a constant area content is formed. At the output of the switch 111, the signal which is inverted relative to the output of the switch 112 is formed. The inverted signal and the non-inverted signal are added at the adder 63. The addition result is given to the regulator of a supply voltage—in the case shown, the negative supply voltage $U_-$—of the switches 111 and 112, via a regulator 65 and a filter 131, in which the regulator can be an I-regulator. This causes the switches 111 and 112 to be regulated in such a way that the area content of the respective positive and negative (inverted) precision impulses IPF, $\overline{IPF}$ is equally great. This compensates for any deviations in the turn-on and shut-off edges of the precision impulses IPF, $\overline{IPF}$. The signal of the precision impulses IPF, regulated in this way, can then be given to the low-pass filter 133 via the transmission segment 25, and the lowpass filter 133 makes the signal available, at its output, for further analog processing as a constant voltage U.

Figure 4:
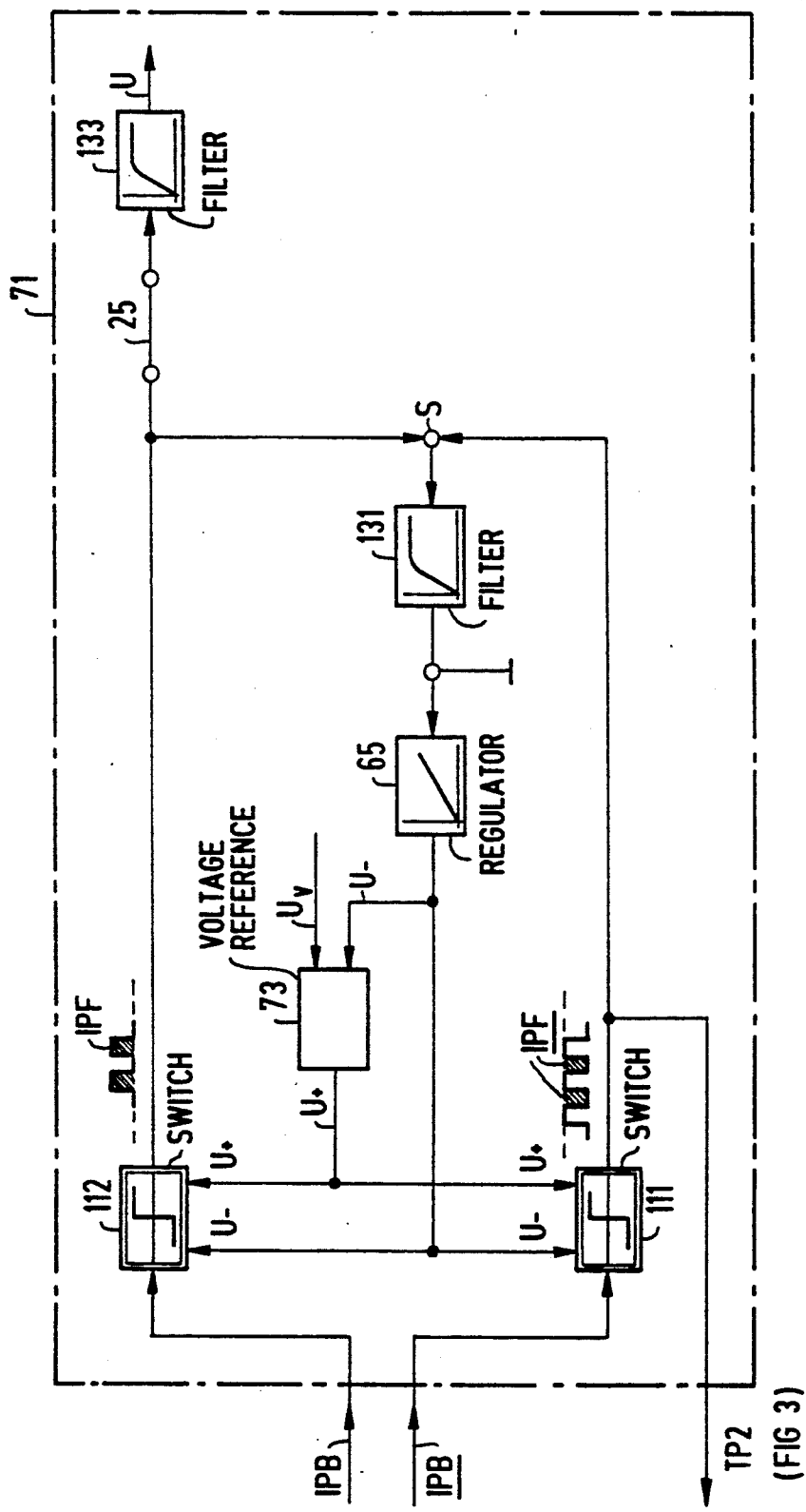
FIG. 4 depicts a block diagram of a device for additional analog processing of the signal, with a symmetrical median point voltage.

FIG. 4 shows the block diagram of a further analog control device 71. In addition to the analog control device 61 shown in FIG. 3, the analog control device 71 according to FIG. 4 contains a voltage reference source 73, with which the positive supply voltage U+ of the precision switches 111, 112 is also regulated. A supply voltage $U_v$ is applied to the reference voltage source 73, and it receives the negative voltage U- from the output of the regulator 65. The input of the regulator 65 is set to zero. With this circuitry, the result achieved is that the total of the amounts of the negative and the positive supply voltage U-/U+ of the precision switches 112, 111 is constant, and that the supply voltages U-/U+ lie symmetrically around a preset center point voltage, preferably ground potential.

As a condition of the frequency division of the output signal $U_V$ of the VCO 5 by means of the frequency divider 7, the precision impulses IPF/$\overline{\text{IPF}}$ generated in the analog control device 71 are so precise that highly precise analog evaluation via the low-pass filter 133 can take place without additional measures.

Figure 5:
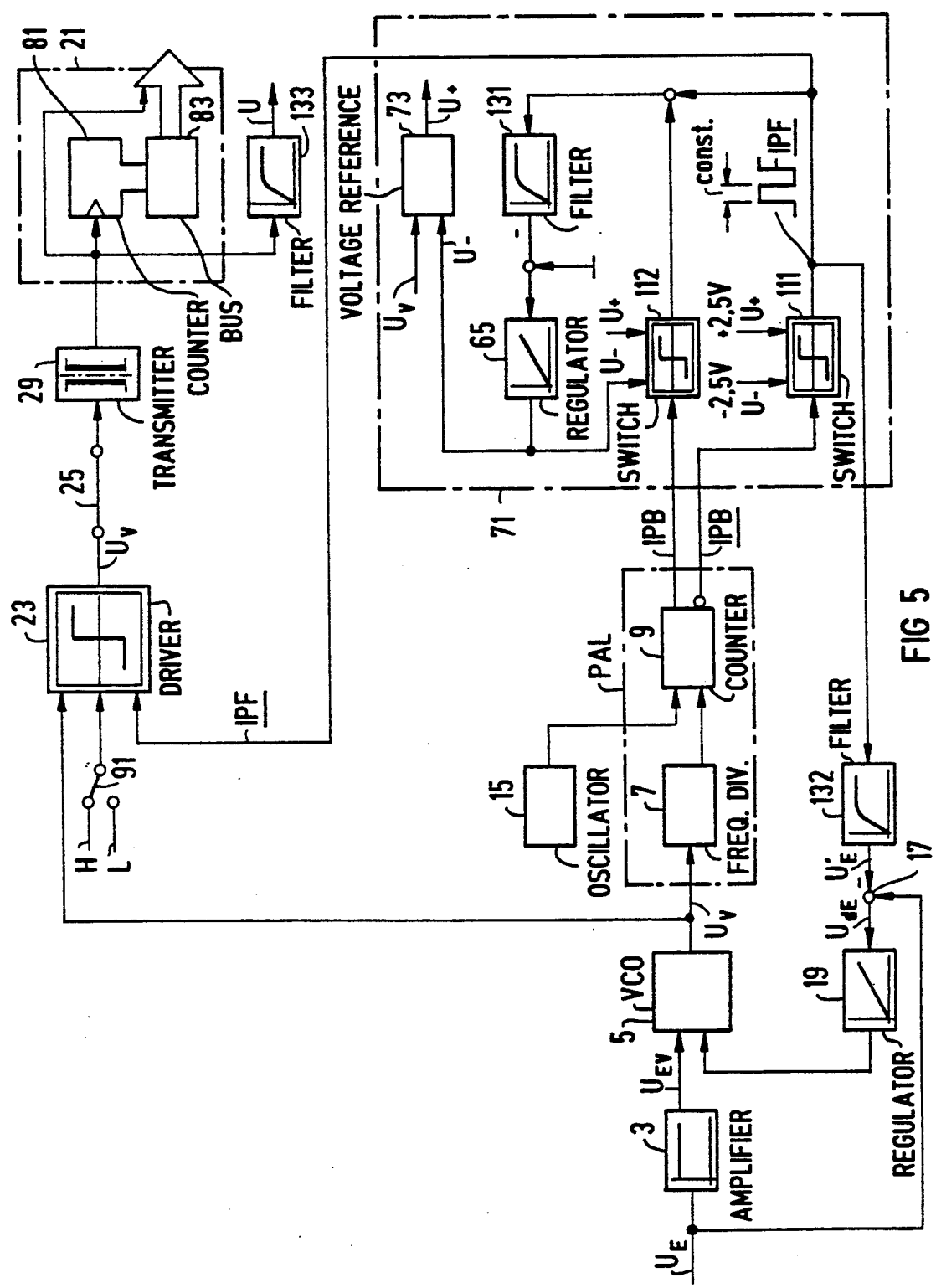
FIG. 5 shows the block diagram of a device with additional digital and analog processing of the signal.

The block diagram according to FIG. 5 shows a device for voltage frequency transformation with optional digital or analog additional processing of the signal. This block diagram is essentially a summarization of the devices shown in FIG. 1 and FIG. 4. To generate the precision impulse IPB with a constant pulse width, the impulse counter 9 was optionally used with the oscillator 15. For further digital processing, the output signal $U_y$ of the VCO 5 is passed to the evaluation logic 21 via the driver 23 and the transmission segment 25. The signal can be galvanically uncoupled by a transmitter 29, which can be arranged optionally in front of or behind the transmission segment 25. For digital evaluation, the evaluation logic 21 contains a binary counter 81, which counts the impulses of the voltage-proportionate digital signal Uv during a preset period, and gives them to a bus system 83 as a binary-coded numerical value. Since the binary place with the lowest value exactly corresponds to half the frequency of the counter input signal $U_y$, this signal can be used directly, as the output signal of the counter 81, and therefore the resolution of the counter 81 can be doubled. (This principle is the object of a separate U.S. application which is related to the European patent application 90 108 326.1 "Digital Counter Circuit.") This corresponds in its effect to a doubling of the frequency deviation of the voltage-controlled oscillator VCO 5.

For further analog processing, the switch 91 merely has to be placed the other way, so that the driver 23 passes the regulated precision impulses, instead of the signal $U_y$, to its output. The analog control device 71 corresponds exactly to the one described in FIG. 4.

In digital evaluation, the impulses P of the output signal $U_y$ of the VCO 5 are counted during a specific time interval. For the evaluation, it is particularly advantageous to count the impulses during a preset time interval, and to repeat this counting periodically, at a shorter time interval. This evaluation can be designated as a "sliding window." For example, the number of impulses P during a time period of T=100 msec. could be counted, where the counting is carried out periodically at intervals of 5 msec.

The transmission of a high pulse sequence frequency (for example 40 MHz) to the evaluation logic 21, via the driver stage 23 and the transmission segment 25, is not critical for digital evaluation, since only low demands are set with regard to the shape of the impulses P, so that the quality of the method is not detrimentally affected by "looping" of the impulses P, as long as the impulses P can still be recognized by the evaluation logic 21. If an impulse P cannot, in fact, be recognized any longer, no lasting error occurs, since only the accuracy of a count during one time interval is affected. The method accordingly demonstrates great resistance to interference.

What is claimed is:

1. A method for voltage frequency transformation comprising the steps of:
   a) applying an input voltage ($U_E$) to an integrating voltage-controlled oscillator to form an output signal ($U_v$);
   b) dividing the output signal ($U_v$) of the voltage-controlled oscillator with a frequency divider to form a divided output signal ($U_T$);
   c) transforming the impulses ($P_T$) of the divided output signal ($U_T$) into an impulse sequence (IPB) with a constant pulse width;
   d) forming precision impulses (IPF) with a constant area by regulating an amplitude of the impulse sequence (IPB);
   e) generating a constant voltage (UE,) from the precision impulses (IPF);
   f) forming a difference voltage ($U_{dE}$) from the constant voltage (UE) and the input voltage (UE); and
   g) applying the difference voltage ($U_{dE}$) to the voltage-controlled oscillator via a controller ($R_j$).

2. The method according to claim 1, wherein the step of transforming the individual pulses ($P_T$) of the divided output signal further comprises generating the impulse sequence (IPB) with a constant pulse width using an impulse counter, wherein the impulse counter outputs a logic "1" output signal ($U_R$) when reaching a preset number of counter clock signals.

3. The method according to claim 2, further comprising the step of clocking the impulse counter with a clock signal derived from a quartz oscillator.

4. The method according to claim 2, further comprising the step of clocking the impulse counter with a clock signal derived from a resistor-capacitor circuit.

5. The method according to claim 1, wherein the step of transforming the pulses ($P_T$) of the divided output signal further comprises generating the impulse sequence (IPB) with a constant pulse width using an clocked bistable switch, and clocking the clocked bistable switch with a clock signal derived from a resistor-capacitor circuit.

6. The method according to claim 1, further comprising the steps of:
   a) generating inverted precision impulses ($\overline{\text{IPF}}$);
   b) forming a control value from a total of the precision impulses (IPF) and the inverted precision impulses ($\overline{\text{IPF}}$); and
   c) controlling the step of forming the precision impulses (IPF) with the control value in such a way that a voltage-time area of the precision impulses (IPF) and the inverted precision impulses ($\overline{\text{IPF}}$) are equal.

7. The method according to claim 6, wherein the step of forming the precision impulses further comprises the steps of:
   a) inputting the impulse sequence to a first precision switch;

b) forming an inverted impulse sequence (IPB);
c) inputting the inverted impulse sequence (IPB) into a second precision switch; and
d) regulating a positive and a negative supply voltage of the first and second precision switches to generate the precision impulses (IPF) and the inverted precision impulses ($\overline{IPF}$) so that the total of the precision and inverted precision impulses (IPF, $\overline{IPF}$) is constant and the precision and inverted precision impulses (IPF, $\overline{IPF}$) lie symmetrically around a preset median voltage.

8. The method according to claim 7, further comprising the steps of:
a) transmitting the precision or inverted precision impulses (IPF, $\overline{IPF}$) via a transmission segment; and
b) transforming the precision or inverted precision impulses (IPF, $\overline{IPF}$) into a constant voltage for further analog processing.

9. The method according to claim 1, further comprising counting pulses (P) of the output signal ($U_v$) of the integrating voltage-controlled oscillator in an evaluation logic, during a preset time span with a preset period.

10. The method according to claim 9, wherein the step of counting pulses (P) further comprises clocking a digital counter with a rising and falling edge of the individual pulses.

11. The method according to claim 9, wherein the step of counting the pulses further comprises the steps of:
a) clocking a digital counter with the output signal ($U_v$) of the voltage-controlled oscillator (VCO), whereby outputs of the digital counter represent binary positions; and
b) using the output signal of the voltage-controlled oscillator (VCO) to represent an additional binary position.

12. A device for voltage frequency transformation comprising:
a) an amplifier receiving an input voltage and outputting an adjusted input voltage ($U_{EV}$);
b) an integrating voltage-controlled oscillator having a first coupled to the amplifier and having a second input and outputting an output signal having individual pulses (P);
c) a control segment coupled to the integrating voltage-controlled oscillator forming a constant output voltage ($U'_E$);
d) a comparator coupled to the control segment comparing the constant output voltage ($U'_E$) to the input voltage and outputting a difference voltage ($U_{dE}$);
e) a regulator coupled to the comparator regulating the difference voltage ($U_{dE}$) and having an output coupled to the second input of the integrating voltage-controlled oscillator;
f) a driver stage coupled to the integrating voltage controlled oscillator;
g) a transmission segment coupled to the driver stage; and
h) an evaluation logic coupled to the transmission stage evaluating the output signal.

13. The device according to claim 12, wherein the control segment further comprises:
a) a frequency divider coupled to the integrating voltage-controlled oscillator receiving the output signal ($U_v$) and forming a divided output signal ($U_T$) with individual impulses ($P_T$);
b) an impulse counter coupled to the frequency divider forming an inverted impulse sequence ($\overline{IPB}$) with a constant pulse width;
c) a precision switch coupled to the impulse counter forming inverted precision impulses ($\overline{IPF}$) with a constant area by regulating an amplitude of the inverted impulse sequence ($\overline{IPB}$); and
d) a low-pass filter coupled to the precision switch forming the constant voltage ($U'_E$) from the inverted precision impulses.

14. The device according to claim 13 further comprising a quartz oscillator clocking the impulse counter.

15. The device according to claim 13 further comprising a resistor-capacitor circuit clocking the impulse counter.

16. The device according to claim 13, wherein the impulse counter further comprises:
a) a D flip-flop having a clock input coupled to the frequency divider receiving the divided output signal, having an inverted reset input, having an output outputting an impulse sequence (IPB) with a constant pulse width, and having an inverted output outputting the inverted impulse sequence ($\overline{IPB}$);
b) a field-effect transistor having a gate coupled to the D flip-flop receiving the inverted impulse sequence ($\overline{IPB}$), having a source coupled to ground and having a drain;
c) a voltage supply;
d) a first resistor coupled between the voltage supply and the drain;
e) a capacitor coupled between the source and the drain;
f) a comparator having a first input coupled to the drain, having a second input, and having an output coupled to the reset input of the D flip-flop;
g) a second resistor coupled between the voltage supply and the second input of the comparator; and
h) a third resistor coupled between the second input of the comparator and the source.

17. The device according to claim 16, further comprising:
a) a second precision switch coupled to the output of the impulse counter having a positive voltage supply input receiving a positive supply voltage, having a negative voltage supply input, and outputting the precision impulses (IPF) by regulating an amplitude of the impulse sequence (IPB);
b) an adder coupled to the precision switch and the second precision switch adding the precision impulses and the inverted precision impulses;
c) a second low-pass filter coupled to the adder;
d) a second regulator coupled to the second low pass filter outputting a negative supply voltage, wherein the precision switch has a positive voltage supply input receiving the positive supply voltage and a negative supply voltage input coupled to the second regulator, and the negative supply voltage input of the second precision switch is coupled to the second regulator.

18. The device according to claim 17, further comprising a voltage reference source having a first input coupled to the second regulator, having a second input coupled to the integrating voltage controlled oscillator, and outputting the positive supply voltage, wherein the second regulator has an input held to zero potential, whereby a total of the positive and negative supply voltages is constant and the positive and negative supply voltages are symmetric about a preset center point.

19. The device according to claim 18, further comprising a transmitter galvanically uncoupling the output signal ($U_v$) of the integrating voltage-controlled oscillator coupled between the transmission stage and the evaluation logic, wherein the evaluation logic further comprises a binary counter coupled to the transmitter counting individual impulses of the output signal during a preset period and outputting a binarycoded numeric value, and a bus system coupled to the binary counter, whereby the output signal represents a least significant bit while the binary coded numeric value represents all remaining bits.

* * * * *